(12) United States Patent
Morgan

(10) Patent No.: US 6,445,505 B1
(45) Date of Patent: Sep. 3, 2002

(54) SPOKE LIGHT RECAPTURE IN SEQUENTIAL COLOR IMAGING SYSTEMS

(75) Inventor: Daniel J. Morgan, Denton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/995,141

(22) Filed: Nov. 27, 2001

Related U.S. Application Data (62) Division of application No. 09/572,470, filed on May 17, 2000, now Pat. No. 6,324,006.
(60) Provisional application No. 60/134,423, filed on May 17, 1999.

(51) Int. Cl.[7] .......................... G02B 27/10; G02B 3/00; H04N 9/12
(52) U.S. Cl. ........................ 359/618; 359/722; 348/742
(58) Field of Search ................................ 359/618, 722, 359/634, 639, 291, 298, 885, 561, 581, 589; 348/743, 742; 353/7, 29, 31, 32, 55, 84; 382/162, 167, 181

(56) References Cited

U.S. PATENT DOCUMENTS

| | | | |
|---|---|---|---|
| 5,061,049 A | | 10/1991 | Hornbeck |
| 5,583,688 A | | 12/1996 | Hornbeck |
| 6,054,832 A | * | 4/2000 | Kunzman et al. ........... 318/600 |
| 6,266,105 B1 | * | 7/2001 | Gleckman ................... 348/743 |
| 6,310,591 B1 | | 10/2001 | Morgan |
| 6,324,006 B1 | * | 11/2001 | Morgan ....................... 359/618 |

* cited by examiner

Primary Examiner—Georgia Epps
Assistant Examiner—Saeed Seyrafi
(74) Attorney, Agent, or Firm—Charles A. Brill; Wade James Brady III; Frederick J. Telecky, Jr (57) ABSTRACT

A method and display system for using the light (110) passing through the spokes of a color wheel (100). The light is a mixed and rapidly changing color. Adding all of the spoke times produces white, but adding a subset creates color artifacts. The spoke times cannot all be added at the same time without altering the white point of the display. The spoke times are added in a sequence and the sequence is altered over time for the same pixel such that the pixel converges to white over time. The pattern of spoke bits is arranged so that as adjacent spoke bit pixels are added, the net spoke light converges to white. The patterns are also varied so that as more and more spoke bit periods are turned on, the net spoke light converges to white. Each spoke bit period adds n-LSBs of white light intensity, so as each spoke bit period is added, n-I LSBs of white light are subtracted from the white data.

11 Claims, 3 Drawing Sheets

PATTERN FOR ANY "SPOKE-BIT-GROUP"

SHOWS ORDERING OF PIXEL COLORS WHEN BOUNDARY DISPERSION IS USED IN 50% CHECKERBOARD MODE

SPOKE LIGHT RECAPTURE IN SEQUENTIAL COLOR IMAGING SYSTEMS

This application is a divisional application of application Ser. No. 09/572,470 filed May 17, 2000, issued Nov. 27, 2001 as U.S. Pat. No. 6,324,006, which claims priority from provisional application number 60/134,423 filed May 17, 1999.

CROSS-REFERENCE TO RELATED APPLICATIONS

The following patents and/or commonly assigned patent applications are hereby incorporated herein by reference:

| Patent No. | Filing Date | Issue Date | Title |
| --- | --- | --- | --- |
| 5,061,049 | Sept. 13, 1990 | Oct. 29, 1991 | Spatial Light Modulator and Method |
| 5,583,688 | Dec. 21, 1993 | Dec. 10, 1996 | Multi-Level Digital Micromirror Device |
| 09/370,419 | August 9, 1999 | Which is now U.S. Pat. No. 6,310,591 | Spatial-Temporal Multi-plexing for High Bit-Depth Resolution Displays |

FIELD OF THE INVENTION

This invention relates to the field of display systems, more particularly to display systems using sequential color techniques such as color wheels.

BACKGROUND OF THE INVENTION

Modem display systems typically create full-color projected images by projecting three single-color images. The eye of the viewer integrates these single-color images to give the perception of a single, full-color image. Three separate modulators or controllable light sources are often used simultaneously to generate the primary-color images. For example, three liquid crystal display (LCD) panels or digital micromirror device (DMD) arrays and appropriate dichroic filters create three primary-color images using a single light source, or three cathode ray tubes perform both the modulator and light source functions to create three primary-color images.

Alternatively, a single modulator is used with a sequential color light source to sequentially create three primary-color images. If the light source sequences through the primary colors fast enough, the viewer will not see the sequential single-color images but instead will see a single full-color image. A sequential color light source is formed by combining a white-light source with a filtering means such as a color wheel.

A color wheel typically is a disk-shaped assembly of dichroic filters. Other shapes of "color wheels" are possible, such as rotating drums or polygons. The white-light beam is focused on the color wheel and the dichroic filters, which are either transmissive or reflective, filter the white light to form a primary-color light beam. The color wheel includes at least one filter for each of the primary colors.

Spinning the color wheel so that each filter passes through the point at which the white light beam strikes the color wheel generates a sequential primary color light beam. The color wheel typically is spun fast enough to create at least one primary color period for each primary during each frame of a video image. Spinning the wheel faster, or using multiple filter segments for one or more of the primary colors can reduce color separation artifacts that allow the viewer to detect the sequential color nature of the display system.

While a sequential color display system typically costs less to produce than a simultaneous color display system, images created by a sequential filtered color display system are not as bright as images created by simultaneous color display systems using the same light source. This is because at any given time only a portion of the light generated by the light source is being used to form the image. For example, when using a three-color equal-segment filter wheel, each primary color is produced only ⅓ of the time. Additionally, when a sequential filter such as a color wheel is used, the light during the filter transitions, typically called spoke times, will be a varying mixture of the two filters being changed in and out. This mixed-color light is not used since using the mixed color light would adversely affect the color purity of he created image.

High image brightness is one of the major desires of customers in the projection display market. Therefore, a method and system for increasing the brightness of a projected image is needed.

SUMMARY OF THE INVENTION

Objects and advantages will be obvious, and will in part appear hereinafter and will be accomplished by the present invention which provides a method and system for using spoke light, that is light generated during color filter transitions, to increase the brightness of an image. One embodiment of the claimed invention provides a method of producing an image. The method comprising the steps of: providing a sequential color beam of light, the sequential color beam of light changing color during each frame period, each frame period comprising: at least two primary color periods; and at least one spoke period during which the sequential color beam of light changes color, modulating the sequential color beam of light during the primary color periods with primary color intensity data, modulating the sequential color beam of light during at least one spoke period with combined-color intensity data, and focusing the modulated sequential color beam of light on an image plane to form a multi-color image.

According to another embodiment of the present invention a display system is provided. The display system comprising: a sequential color light source operable to provide a sequential color beam of light along a light path, the sequential color beam of light having at least two periods of primary color light each frame period and at least one spoke period during which the sequential color beam of light changes color, a modulator disposed on the light path and operable to modulate the sequential color beam of light in response to image data received by the modulator, and a controller operable to receive input intensity data and process the input intensity data to yield primary color output intensity data and combined color output intensity data, the controller transmitting the primary color output intensity data and the combined color output intensity data to the modulator such that the modulator modulates the sequential color beam of light with the primary color output intensity data during the periods of primary color light and with the combined color output intensity data during at least one spoke period

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a plan view of a color wheel showing the region the light beam passes through.

DETAILED DESCRIPTION OF THE PREFERRED EMBODIMENTS

A new technique has been developed that allows the modulator of a sequential color display system to operate during spoke periods without creating noticeable artifacts. The technique provides a significant brightness and contrast ratio boost to the image produced by the display system.

Prior art display systems turn the modulator off during the spoke periods to avoid degrading the color purity of the image produced. This is because the light produced during the spoke periods is multi-colored and cannot be modulated with primary color intensity data without adding an unwanted and improper color component to the image. The invention described below teaches a method and architecture for using the spoke period light that keeps image artifacts below a perceptible threshold.

Figure 1:
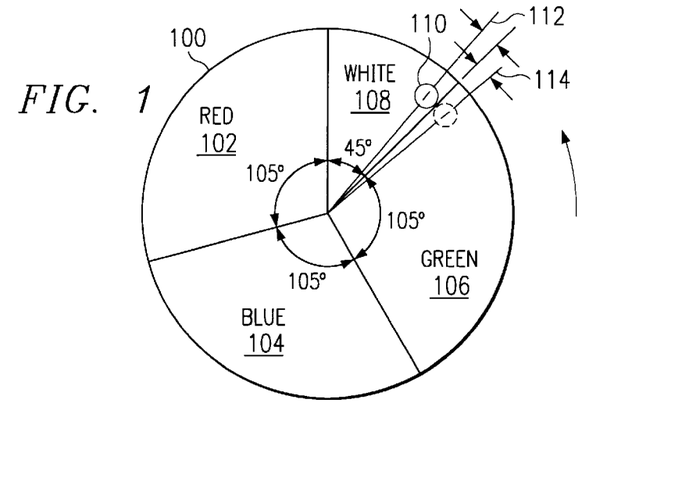

FIG. 1 is a plan view of a four-segment color wheel 100. The color wheel 100 has a red segment 102, a blue segment 104, a green segment 106, and a white segment 108. The color wheel is spun in the direction shown so that a stationary light spot—the portion of the color wheel that the white light beam strikes—passes through each segment in a complete revolution. Thus, as the wheel is turned, the light spot travels from the white segment through the green segment, through the blue segment, through the red segment, and through the white segment again. In FIG. 1, each of the three primary color segments is 105° wide while the white segment is 45° wide.

The color wheel 100 of FIG. 1 is typically spun at twice the frame rate. Spinning the color wheel 100 at twice the frame rate produces two periods in each frame in which the white light spot is completely within each filter segment. The two periods, produced one-half frame period apart, reduce the color separation artifacts that can occur with moving images or viewer eye movement. Although a specific embodiment of a color wheel is shown in FIG. 1, it should be understood that many other embodiments are equally possible. For example, a three-segment wheel using only the three primary colors, a five segment wheel including two red segments, or many other embodiments. Wheels that include unequal numbers of primary color segments may introduce color artifacts when using aspects of this invention. This invention, however, includes a means to correct any color errors due to the additional filter transitions. The correction means is called spoke-hue trim.

Radial 112 shows the point at which the white light spot 110 first reaches the green filter segment 106. Thus, when the center of the white light spot 110 crosses radial 112, the color produced by the filter wheel begins to transition from white to green. When the white light spot 110 is centered on radial 114 only green light is produced by the color wheel. Therefore, radials 112 and 114 are separated by the width of the white light spot 110 at the point the center of the white light spot 110 crosses the radials.

The time it takes for the white light spot 110 to transition across a filter spoke—from radial 112 to radial 114—is approximately 400 μS in a typical system that spins the color wheel at twice the frame rate. As discussed below, this transition period will be divided into two separate bit periods each capable of displaying unique image data. Since the spoke transition will be utilized as two separate bit periods, the transition periods must be at least twice as long as the device load period. For the purposes of this disclosure the device load period is assumed to be 200 μS and the transition period is assumed to be 400 μS.

Since the color wheel turns two complete revolutions each frame period, there are eight transition periods each frame. At a 60 Hz frame rate, the fame period is 16,667 μS and the eight 400 μS transition periods consume 3,200 μS—or 19.2% of the frame period. The purpose of the novel method and apparatus discussed herein is to allow the display system to use the light generated during this heretofore unused portion of the frame period in order for the display system to create brighter images without the use of a brighter light source.

Throughout this disclosure, the image and pixel intensities will be discussed, often in numerical terms. These intensity values represent the manner in which intensity values are processed in a digital display system. Each pixel of an image will be represented by an intensity value for each of the primary colors. For example, a pixel will have a red, green, and blue (RGB) intensity value. A pixel in an 8-bit display system may have RGB intensity values of (127, 127, 127) which would mean each of the primary colors was enabled at one-half of its maximum intensity.

Since equal amounts of red, green, and blue create white in an additive display system the pixel could also be considered to have a white intensity value of 127. Thus, a display using the color wheel of FIG. 1 can be thought of as a four-primary color display system and the data can be represented in RGBW form even though there are actually only three primary colors being used.

Furthermore, when it is necessary to generate white light for a pixel, either to create a white pixel or to de-saturate a pixel, the white light source can be either the white segment (W-white) or a combination of equal amounts of RGB light (RGB-white). Since the white light created by mixing light from the three primaries and the white light from the white segment often have different color temperatures, display systems utilizing both W-white and RGB-white need to either use a constant ratio of the W-white to RGB-white, or compensate for the differences introduced by a changing ratio.

Most display systems that use a white light source and a color wheel create single-color light beams that do not have equal intensities. For example, the green light beam created by many display systems is much more intense than the red light beam. The eye perceives colors in the natural world at different intensities. For example, 70% of the intensity (lumens) of white light comes from the green light component. Typical ratios for light that is perceived as white are 20% red, 70% green, and 10% blue. Display systems mimic this ratio, by tuning the display period (color wheel segment size), light source, and filter pass-band characteristics, to produce natural looking whites. This disclosure will ignore methods used to compensate for unequal intensities and focus solely on the methods used to utilize the spoke light and methods used to correct the hue of images to which spoke light has been added.

One method of increasing the brightness of a sequential color display system is based on the realization that, while each individual spoke period cannot be used to produce an image since the spoke period does not contain pure primary colored light, the light generated during all of the transitions between primary colors creates white light and can contribute to the white component of an image. Not only does this method increase the intensity of unsaturated images or pixels, it also increases the intensity of saturated pixels since the additional white light allows the use of a smaller white segment—thus increasing the size of the primary color segments.

This disclosure will use the phrase "turn on the spoke period" to refer to operating the light modulator forming a pixel during the spoke period to utilize the light generated during the spoke period. When the spoke period is turned off, light from the color wheel still passes to the light modulator, it just isn't used to contribute to the image pixel. When the spoke period is turned on, the light modulator uses the light generated during the spoke period to contribute to the pixel. Since each pixel can have a unique intensity, during a given spoke period many images will require the light modulator to use the spoke period light for some, but not all, pixels. Thus, turning a pixel on or off is only meaningful in terms of a given pixel, and this discussion should be understood to describe operation only for a single pixel or for an array of pixels having identical intensity data.

The simplest method of using the spoke light is to simply utilize the light from all spoke periods. A four-segment color wheel spinning at twice the frame rate has eight spoke periods each frame. Assuming a 60 Hz frame rate and a 400 $\mu$S spoke period, 19.2% of the frame period is consumed by the spoke periods. Thus, turning on all of the spoke periods provides a 19.2% increase in the useable frame period and dramatically increases the amount of light used to form the image.

The magnitude of the intensity increase depends on the characteristics of the color wheel and light source. For example, the combination of the light source and color wheel produces varying amounts of lumens during each single color period and a much higher output during the white segment. The maximum intensity of a pixel without using the spoke periods depends on the characteristics of the filter and light source as well as the proportional useable size of the filter segments. The total contribution of the spoke periods, however, depends on the quantity of each type of filter segment instead of the size of each filter segment. Thus, a 19.2% increase in the useable frame period does not necessarily translate to a 19.2% increase in maximum pixel intensity.

Because each spoke period adds much more than one LSB of white light, some white light is removed from the other components of the pixel when the spoke periods are turned on. The intensity data used to generate RGB-white or W-white, or preferably both, is decreased by an amount one least-significant-bit (LSB) less than the amount of spoke-white light added. Thus, there will be the desired one LSB increase in the white light produced when the spoke bits are turned on.

Unfortunately, turning on all of the spoke periods at one intensity transition point can create both intensity and chromaticity image artifacts. The intensity artifacts are created when an improper amount of RGB-white and W-white is subtracted from the image to compensate for the added spoke-white. Each color filter is different due to manufacturing tolerances. These tolerances result in an RGB-white to W-white ratio that varies wheel to wheel. The variance makes it impossible for the display system to know how much RGB-white and W-white to subtract from the image when the spoke segments are turned on without calibrating each display system during the manufacturing process.

These filter-to-filters variations also create chromaticity artifacts when all of the spokes are turned on at one time. As discussed above, RGB-white and W-white will typically have difference color temperatures. The ratio of RGB-white to W-white light a display system generates without using the spoke periods is a function of the relative color filter sizes—or the time periods devoted to producing each primary color and white—and the transmission characteristics of the filters. The spoke periods collectively produce white light that is both RGB-white and W-white since the spoke periods include both the primary color filter transitions and white segment transitions. The ratio of RGB-white to W-white light produced during the spoke transitions is not based on the relative filter sizes, however, but on the number of each type of filter segment and the transmission characteristics of the filters. Thus, three potentially different white color temperatures are used to generate an image: RGB-white, W-white, and spoke-white.

One method of reducing the artifacts created by turning on all of the spoke periods at one time is to turn on only a fraction of the spoke periods. For example, since the color wheel is described as spinning two revolutions for each frame, at a first pixel intensity level the spoke periods could be turned on during one revolution and not during the next. The remaining spoke periods are then turned on at a higher pixel intensity level. Alternatively, some of the spoke periods are turned on during each of the two revolutions. The particular spoke periods chosen are selected to create white light and can be changed each frame period.

While turning on half of the spoke periods at a time provides two separate, but significant boosts to the image intensity, turning on less than half of the spoke periods each frame period will generate chromaticity errors—at least when using the color wheel of FIG. 1. The chromaticity errors are generated when the spoke periods enabled do not include the same number of leading and trailing edges from each of the primary filters. Using both the leading and trailing edges of a color filter ensures that any alignment error between the filter wheel and the timing of the modulator is canceled out.

Turning on a large group of spoke periods creates intensity artifacts while turning on a small number of the spoke periods creates chromaticity artifacts. What is needed is a method of gradually turning on spoke periods to avoid intensity artifacts while limiting the chromaticity artifacts to a point below the threshold of viewer perception. Such a method is disclosed herein. The method described individually turns on each spoke period as the intensity of a pixel increases, yet minimizes the viewer's perception of the chromaticity errors generated by carefully selecting which spoke is turned on during each frame.

The spoke selection process uses the location of the pixel being generated within an image as well as the intensity level of the pixel to determine which spoke periods are turned on. As the intensity of a pixel is increased, additional spoke periods are turned on. This continues until a sufficient number of spoke periods are turned on and no chromaticity artifacts are created. Thus, as a pixel grows brighter the colors produced by the spoke periods converge to white.

In a similar manner, the spokes selected for display by adjacent pixels at a given intensity level are chosen such that as the resolution of the viewer decreases—that is, as adjacent pixels contribute to a perceived pixel—the spoke light contributed to a region converges to white. Since human viewers perceive intensity information at a higher resolution than chromaticity information, this spatial convergence keeps chromaticity errors below the level of human perception.

Additionally, at a fixed intensity level, the spoke used by a given pixel changes over time. Careful selection of the spoke sequence allows the light from a subset of the spoke periods to converge to white over a very short period. Even a single spoke period per frame can converge to white in three frame periods or less.

Turning on the spoke periods only during the display of very bright images further suppresses the viewer's perception of the chromaticity errors. The ability of the human eye to perceive a fixed chromaticity error diminishes as the image containing the error grows brighter. Thus, while limiting the use of spoke period light does not reduce the magnitude of either the chromaticity or intensity errors, it ensures the errors occur when the human eye is least likely to detect them.

This disclosure will describe an embodiment of the disclosed invention that begins to turn on the spoke periods as the image white level, as indicated by the eight-bit intensity word used to control the modulator during the white segment and spoke periods rises above the value of 144. The description of these embodiments will make many assumptions that are not limitations of the invention disclosed herein. For example, while this written description will assume an 8-bit intensity value for each primary color (RGB) and a separate 8-bit intensity value for a white component, virtually any selection of word sizes is equally applicable. In actuality, the LSB period is typically determined by the minimum load time of the system—and therefore constant for each filter color—while the maximum intensity value for each filter color, which determines the required intensity word size, is generally a function of the size of the filter color segment.

Furthermore, while the use of a white segment is described, with a corresponding white intensity value, there is no requirement that the system utilize a white segment. For example. spoke-light recapture could be used in a three primary-color system. Likewise, in some systems—particularly printer systems—the combined color created by the spoke periods will be black instead of white.

Most display systems that utilize a white filter segment also process the input RGB image data to generate a separate intensity word representing the white content of each pixel. This separate white intensity word is used to control the operation of the light modulator during the white filter segment period. The white image component is not removed from the RGB data but instead both the primary color (RGB) data and the white segment data contain white intensity data. This increases the maximum white pixel intensity by allowing all of the light passing through each primary filter and all of the light passing through the white segment of the filter wheel to combine to form a maximum intensity white pixel. Additionally, as mentioned earlier. it is advantageous to mix the white segment light with a constant proportion of RGB-white so that the color temperature of white regions does not change. Therefore, the data used to control the spoke periods can come from either the white segment data or the RGB data, or a combination of both.

Since the display system typically processes the input image data to extract white intensity data for use with the white segment, it generally simplifies the operation of the display system if the white segment data is used to control the modulator during both the white segment and the spoke segments. Using white segment data to control the modulator during both the white segment and the spoke segments changes the color temperature of the white light produced by the white segment data at intensity levels high enough to turn on the spoke segments. The algorithm used to divide the white level of a pixel between white segment data and RGB data can accommodate this contribution of RGB-white by the white segment data so that the color temperature of white pixels remains constant over the entire intensity range.

As described above, the spoke periods are used to generate additional white light in order to increase the intensity of the image display. At the brightest levels, all of the spoke periods are turned on all of the time and the overall system lumens boost is between 11% and 27%, depending on the color wheel used and other factors. Not only does the use of the spoke light increase the image brightness, it also increases the contrast ratio of the system due to the increase in maximum brightness without changing the system black level.

Although all of the spoke periods are turned on when the display system displays an image at its maximum possible brightness, the discussion above warned of artifacts that are created by the different color temperatures of the white-segment white, RGB-white, and spoke-white. Since the spokes create a noticeable shift in the white point when turned on all at once, and since gradually turning on the spokes as the white level increases creates noticeable chromaticity errors, a method and system are needed to enable the spokes to be gradually turned on without creating noticeable artifacts.

As described above, limiting the spoke periods to use with very bright images ensures the artifacts that are inevitably created are created when the capacity of the viewer to detect the artifacts is physiologically reduced. Likewise, the artifacts that are created are dithered to cause the chromaticity errors to converge to zero over space, time, and as the intensity increased.

Before describing how the spoke periods are distributed to avoid artifacts, it is important to understand the color artifacts that are actually created by each spoke period. As mentioned above, the time it takes for the light beam to pass completely through the spoke—that is for the light beam to transition from a first pure color to a second pure color is twice the load time of the modulator array. Since the modulated can be loaded twice during each spoke, the spoke period is divided into two spoke bit periods. Dividing the spoke period into two spoke bit periods allows better control over both the amount of spoke light used and the color of the spoke light.

Figure 2:
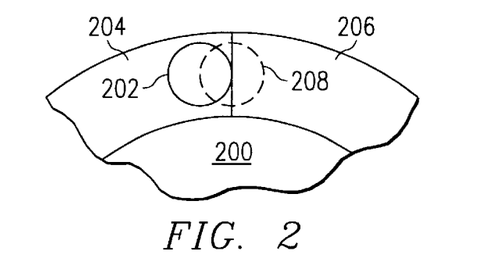
FIG. 2 is a plan view of a portion of the color wheel of FIG. 1 showing the relationship between a minor color and a major color during the first half of a spoke period.

Each spoke bit period creates a different hue of light. FIG. 2 is a plan view of a portion of the color wheel of FIG. 1 showing the light beam passing through the color wheel 200. In FIG. 2, the spoke bit period begins as the beam of light reaches position 202 and just touches the boundary between the first color filter 204, red in this case, and the second color filter 206 which is assumed to be blue. The spoke bit period ends as the light beam reaches the half-way point 208 between the two color filters and is centered on the boundary between them.

Figure 3:
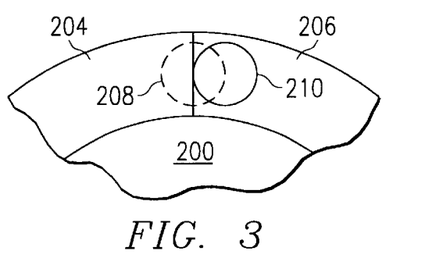
FIG. 3 is a plan view of a portion of the color wheel of FIG. 1 showing the relationship between a minor color and a major color during the first half of a spoke period.

Analysis of FIG. 2 shows that the average light during the first spoke bit period is 75% of the first color and 25% of the second color. In this case, red is the dominant color and blue is the minor color, and the spoke bit period is represented as Rb. FIG. 3 shows the remainder of the spoke period, in which blue is dominate and red is the minor color. The second spoke bit periods is represented as Br.

increasing white intensity level is chosen so that, as the white level increases, the color of a particular pixel quickly converges to white. Table 1 lists one potential sequence as the intended white level is increased. In Table 1, a number after the description of the spoke bit period indicates whether the spoke bit period is used on the first or second motor revolution.

TABLE 1

Spoke-Bit Activation, Phase, and Effective On-Times
(45 degree W segment, 105 degree RGB segments)

| | Phase: W-Level when Spoke-Bit is top left pixel | Spoke-Bit Region Assignment | Spoke-Bit On-Time | Effective On-Time averaged over screen per 60 Hz frame (referenced to white segment luminance) |
|---|---|---|---|---|
| SPOKEBIT(15) | ≧249 d | Gb2 | 200 µS | 82 µS |
| SPOKEBIT(14) | ≧242 d | Wr2 | 200 µS | 82 µS |
| SPOKEBIT(13) | ≧235 d | Br2 | 200 µS | 82 µS |
| SPOKEBIT(12) | ≧228 d | Wg2 | 200 µS | 82 µS |
| SPOKEBIT(11) | ≧221 d | Rw2 | 200 µS | 82 µS |
| SPOKEBIT(10) | ≧214 d | Bg2 | 200 µS | 82 µS |
| SPOKEBIT(9) | ≧207 d | Gw2 | 200 µS | 82 µS |
| SPOKEBIT(8) | ≧200 d | Rb2 | 200 µS | 82 µS |
| SPOKEBIT(7) | ≧193 d | Gb1 | 200 µS | 82 µS |
| SPOKEBIT(6) | ≧186 d | Wr1 | 200 µS | 82 µS |
| SPOKEBIT(5) | ≧179 d | Br1 | 200 µS | 82 µS |
| SPOKEBIT(4) | ≧172 d | Wg1 | 200 µS | 82 µS |
| SPOKEBIT(3) | ≧165 d | Rw1 | 200 µS | 82 µS |
| SPOKEBIT(2) | ≧158 d | Bg1 | 200 µS | 82 µS |
| SPOKEBIT(1) | ≧151 d | Gw1 | 200 µS | 82 µS |
| SPOKEBIT(0) | ≧144 d | Rb1 | 200 µS | 82 µS |
| Single Spoke Bit Group | N/A | N/A | N/A | 89 µS (7 LSBs of 8-bit WBUS) |
| All Spoke Bit Groups | N/A | N/A | N/A | 1420 µS (112 LSBs of 8-bit WBUS) |
| Full Scale System White | N/A | N/A | N/A | 6600 µS (W-white, RGB-white, Spoke-white) |
| Full Scale 8-bit WBUS White | N/A | N/A | N/A | 3090 µS (W-white, Spoke-white) |

Figure 4:
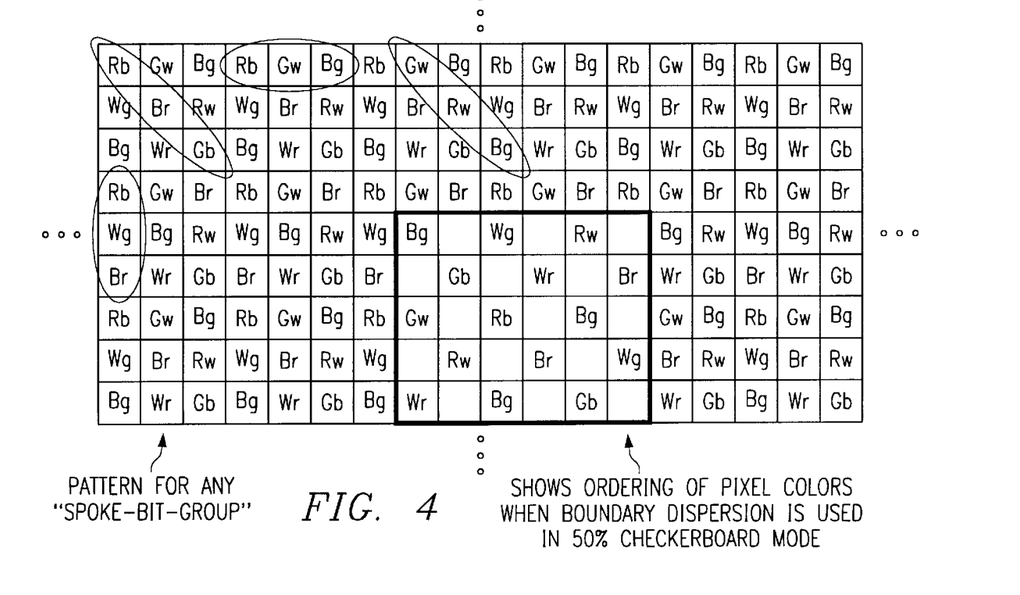
FIG. 4 is a plan view of a portion of an array of pixels showing the spatial mixing of the spoke periods used to prevent color artifacts.

As described above, spatial dithering is used to limit the ability of a viewer to notice the chromaticity errors caused by the use of a partial set of spoke periods. Spatial dithering uses a pattern for adjacent pixels based on a given white intensity level. A portion of the pattern is shown in FIG. 4. The pattern determines which spoke bit period is used for each pixel a given intensity level. Each primary color, both dominate and minor, in any pixel of FIG. 4, is surrounded by two matching colors (for a total of three) and three of each of the other primary colors. Therefore, over a small 3×3 pixel region the spoke colors integrate to a white level. In other words, as the size of a region increases, the color of the region converges to white. As mentioned earlier, the human eye has higher resolution when detecting intensity changes compared to chromaticity changes. Therefore the eye naturally integrates color information with the surrounding pixels and helps to hide the chromaticity errors.

The pattern of FIG. 4 is only used for a single spoke bit period. That is, as the WBUS value indicating the white signal component reaches 144 for each pixel, the pattern of FIG. 4 is used to turn on a single spoke bit period each frame. When the WBUS value increases by seven to 151, another spoke bit period is turned on and the WBUS data value driven to the white segment reduce to achieve a net 1-bit increase in the combined intensity of the spokes and white segment.

Figure 5:
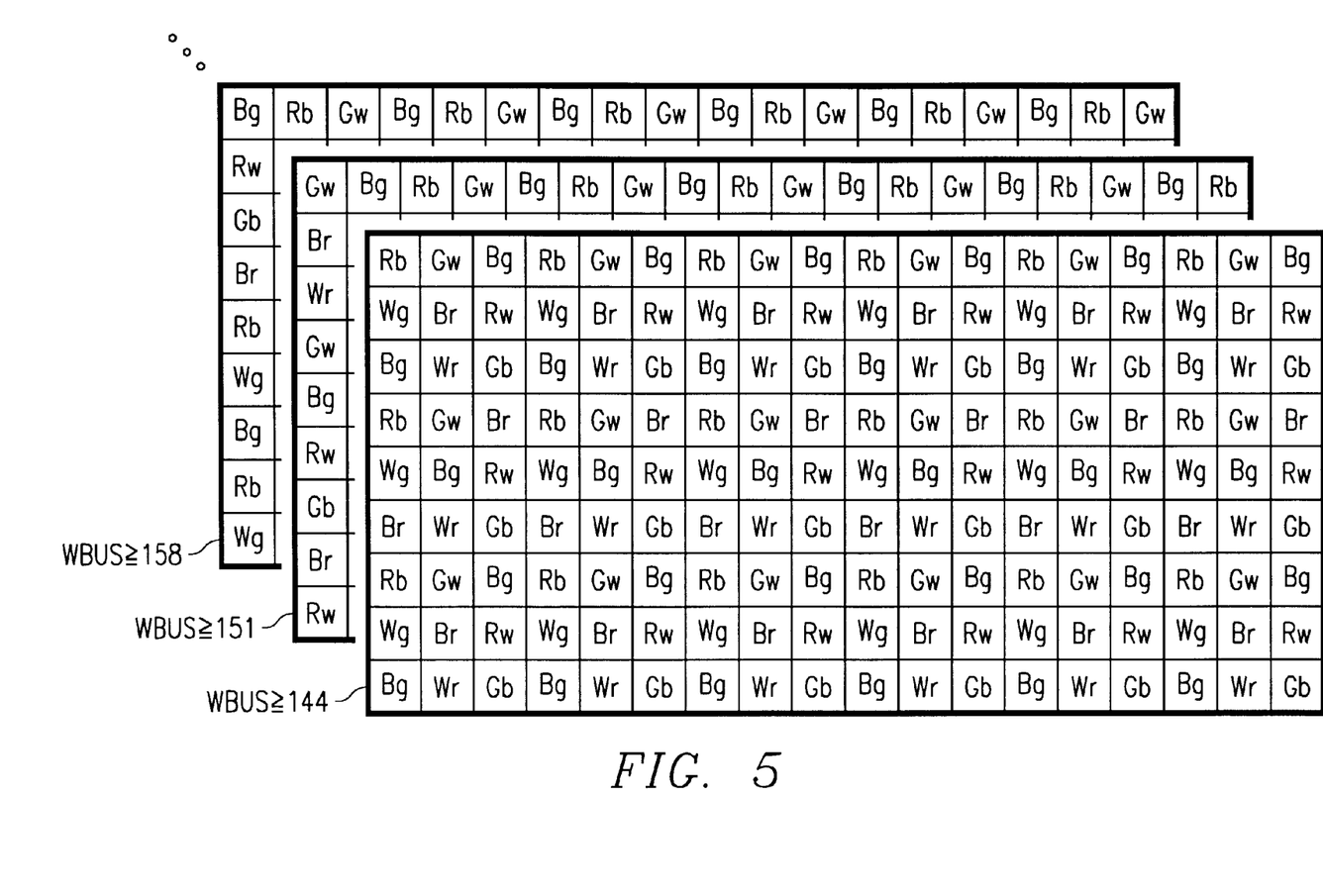
FIG. 5 is a sequence of plan views of the portion of an array of pixels shown in FIG. 4 showing the mixing of the spoke periods over intensity used to prevent color artifacts.

As each spoke bit period is added, a different pattern is used. FIG. 5 shows a portion of three of these spoke bit period patterns. The alignment of the patterns for each Not only does a pixel converge to white as the intensity increases, a single pixel at a given intensity also converges to white over time. This is due to the rotation of the patterns over time. If a different spoke bit period is used to represent the same intensity level of the same pixel each frame, then after 16 frames each of the spoke bit periods will be used—even when only one spoke bit period is enabled each frame. While all 16 frames are required for a perfect convergence, careful selection of the sequence ensures the pixel is nearly converged to white after just a few frames.

Figure 6:
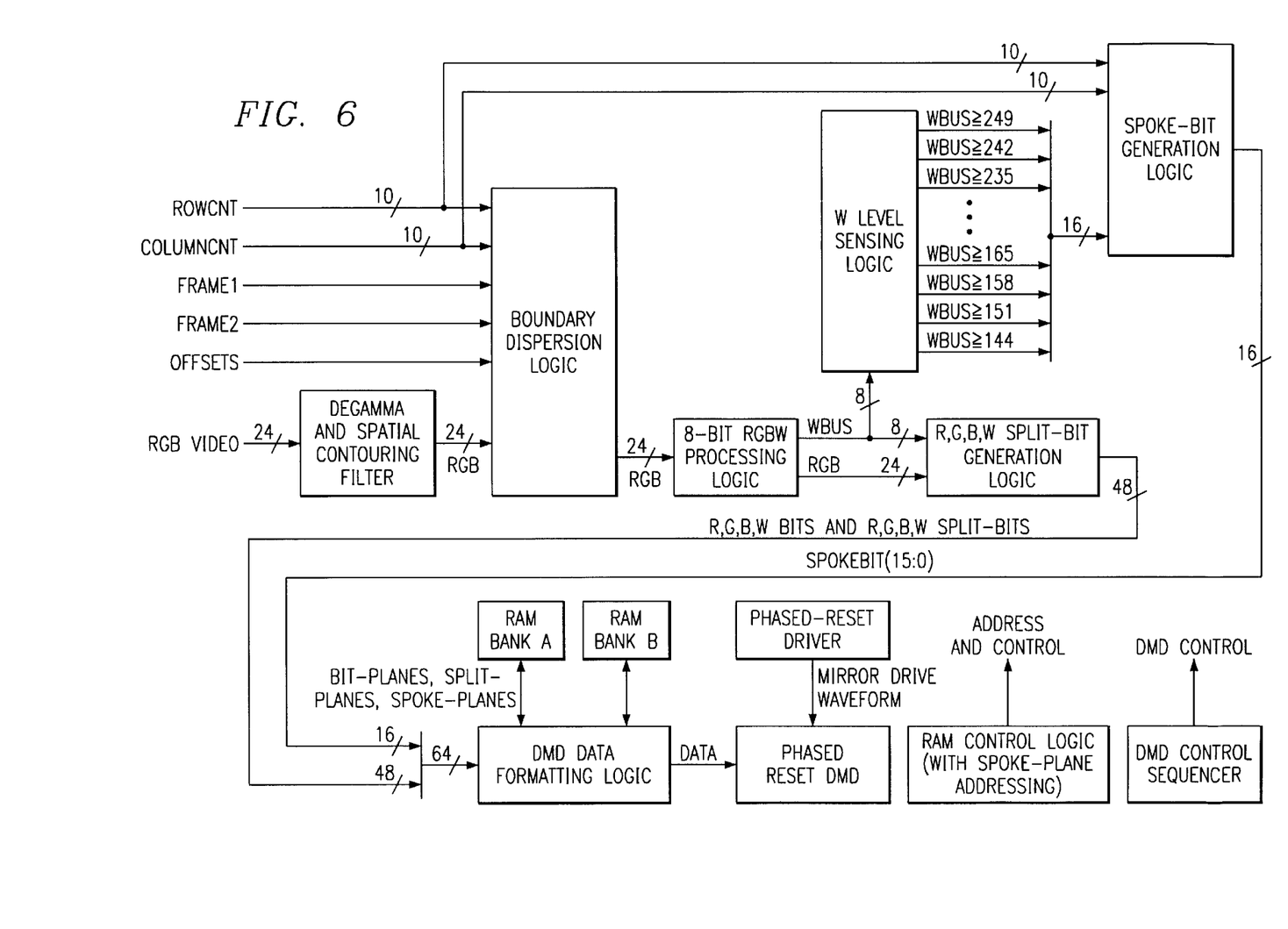
FIG. 6 is a block diagram of one embodiment of a display system implementing spoke-light recapturing.

FIG. 6 is one embodiment of a display system controller operable to implement spoke light recapturing as described above. The data processing portion of the system of FIG. 6 receives RGB data from an external source. A degamma function is applied so that the DMD display output matches a CRT response. Since the degamma output is limited to 24 bits, a spatial contouring filter must also be included that diffuses the 8-bit per color quantization errors for low intensity pixels.

The 24-bit RGB output from the spatial contouring filter is the input to the boundary dispersion block. Boundary dispersion reduces any boundary artifacts created when pixel codes cross specific boundaries. These boundaries include boundaries that create PWM temporal contouring artifacts and boundaries due to turning on Spoke-Bit-Groups.

The 24-bit boundary dispersion output is the input to the 8-bit RGBW processing logic. This block outputs 24-bits of RGB data and 8-bits W data. The 24-bits of RGB data and 8-bits of W data (WBUS) are then input to split-bit generation logic where split bits are applied to further mitigate PWM temporal contouring artifacts for R, G, B, and W.

The 8-bit WBUS is also input to the W level sensing logic. This block output 16 level detection signals. These signals are input to the spoke bit generation logic. The spoke bit generation logic outputs the spoke bits according to the spatial multiplexing of spoke bit groups as shown in FIGS. 4 and 5 and per Table 1. The ROWCNT and COLUMNCNT busses are also inputs to the spoke bit generation logic. They are used to indicate the spatial location of each pixel so that the spoke bit generation logic can set the appropriate spoke bits high when a particular level indicator signal is active from the W level sensing logic.

When a spoke bit group is activated by the spoke bit generation logic, an intensity step of 7 LSBs when referenced to the WBUS is taken. However, only a single LSB step is desired. To solve this, the RGBW split bit logic will subtract 6 LSBs from the WBUS prior to outputting data for W bits and W split-bits. In this way, 1 LSB steps are taken at code boundaries where a spoke bit group is turned on.

The purpose of the RGBW split bit logic is to create split bits for RGB and W that control the bit splits for these colors. Since not all bits have bit-splits, some of the 48 outputs will simply be normal pixel data bits. All data bits require some processing in the RGBW split bit logic to account for the non-linear (not powers of 2) nature of the split bits.

The spoke bit generation logic outputs 16 spoke bits and the RGBW split bit logic outputs 48 signals. The 64 combined bits are input to the DMD data formatting logic. The DMD data formatting logic puts the data into digital plane format. 64 digital planes are used. The 64 planes are comprised of: bit planes, split planes, and spoke planes. Data is written to one bank of RAM while the other is being continuously read, and the data written to the DMD. Thus a double-buffer memory is used. The buffers are swapped at each VSYNC which indicates a frame boundary for source pixels.

A DMD waveform for moving the mirrors into the binary states desired by the RGBW data, is generated by the DMD Phased-Reset Driver. A DMD control sequencer is used to load digital planes into the DMD and assign mirror on-time weights as needed for loading the bit-planes, split-planes, and spoke planes. The sequencer also controls the time placement of the phased reset waveform for each DMD reset group.

The previous description stated that when a spoke bit, or group of spoke bits is turned on, a value is subtracted from the white bus so that the white intensity step, which is a combination of the RGB-white, W-white, and spoke-white, does not produce a noticeable quantization step increase in the image. Typically, even a 1 LSB increase of the W-white can still be seen as a quantization step. Thus it is desirable to have a step resolution of less than 1 LSB of W-white when incrementing the intensity or subtracting a value from the W bus when one or more spokes are turned on.

Greater resolution is obtained by using spatial temporal multiplexing (STM) techniques on the W-bus bits. STM is described in U.S. patent application Ser. No. 09/370,419, which is now U.S. Pat. No. 6,310,591, Spatial-Temporal Multiplexing for High Bit-Depth Resolution Displays. One embodiment of STM applied to the present application uses a 50% checkerboard pattern applied to the white LSB and then it is display as effectively as a 0.5 LSB. Or similarly, a 25% pattern could be used to implement 0.25 LSB steps. All of the STM techniques, including using random temporal dithering of the spatial starting point of a spatial pattern from frame-to-frame, may be applied to the W-bus bits. It should be pointed out that the W-bus bits do not have to have binary weights.

Another useful feature, which can significantly improve the implementation of the spoke light recapture, is a Spoke-Hue-Trim (SHT) function. The SHT provides the ability to adjust the R, G, and B channels with +/- offset values. The offset values used depend on the grayscale code. As the grayscale codes increase and a group of spokes are turned on, in some systems it is difficult to get an exact white color coordinate match to the preceding grayscale values. The SHT circuit allows a small offset to be added to or subtracted from the RGB color channels to correct this error. For example, if a grayscale code activates a group of spokes but the white formed by these spokes has a slight reddish hue to it, one or more LSBs are subtracted from the R data bus.

In a more extreme case, an entire white component is removed from the grayscale code when a set of spokes are turned on. For example, if a pixel has the GW spoke and the BR spoke turned on, the SHT can be used to remove the RGB component and leave only the white from the white segment. Graycode steps formed are then managed in terms of the white W part of the spokes. This example gives:

$$GW+BR-r-g-b; \text{ where r, g, and b are the SHT offsets.}$$

There is another way that the SHT can be used beneficially. In some systems the SHT feature gives resolution greater than the W bus even after using spatial temporal multiplexing. For example, if a 50% STM pattern is used on the W bus LSB, where the LSB has an on-time of 60 $\mu$S, then the smallest W-white step is R=G=B=60 $\mu$S/2=30 $\mu$S. If the R, G, and B LSBs are 15 $\mu$S, then additional grayscale resolution is available on the RGB channels. The SHT allows the RGB channels to be used to obtain this additional resolution. SHT allows higher resolution gray steps to be inserted between each 50% STM white segment LSB step (w0/2). For example, the following progression maintains 15 $\mu$S steps:

| Step 1: | 1r + 1g + 1b | (15 $\mu$S gray step, 15 $\mu$S total) |
| Step 2: | w0/2 | (15 $\mu$S gray step, 30 $\mu$S total) |
| Step 3: | w0 − (1r + 1g + 1b) | (15 $\mu$S gray step, 45 $\mu$S total) |
| Step 4: | w0 | (15 $\mu$S gray step, 60 $\mu$S total) |
| Step 5: | w0 + 1r + 1g + 1b | (15 $\mu$S gray step, 75 $\mu$S total) |

Table 2 details one sequence of white bus and spoke bit codes along with the spoke-hue-trim offsets used for one particular system over a range of white values.

TABLE 2

W-BUS, SPOKE BITS, AND SHT CODES

Pixel numbers used in a 2 × 2 spatial checkerboard spoke bit group

Effective W segment weight

Spoke Bits header:

| P1,4 | P1,4 | P2,3 | P2,3 |
|---|---|---|---|
| S(0) | S(1) | S(6) | S(7) |
| RG1 | WB1 | GW2 | BR2 |

.5 means use 50% STM pattern 1 means no STM patterns are used; on 100%

| W Bus 7-bit W Bus1 | Ref W EQ | W Bits PH1 W0 EQ | W Bits PH2 W1 EQ | Spoke-Hue-Trim R | G | B | Comments |
|---|---|---|---|---|---|---|---|
| 0  | 0 | 0   | 0   | 0  | 0  | 0  | Spoke bit number assignment "1" is for color wheel revolution 1 and "2" is revolution 2 |
| 2  | 0 | 0   | 0   | 1  | 1  | 1  | -15us step |
| 4  | 0 | 0.5 | 0   | 2  | 2  | 2  | Take one rgb LSB step |
| 6  | 1 | 0.5 | 0.5 | -5 | -4 | -4 | Use two 50%s to make 100% (via Boundary Dispersion) and to reduce W bit licker |
| 8  | 1 | 0.5 | 0.5 |    |    |    |  |
| 10 | 1 | 0.5 | 0.5 | -4 | -3 | -3 | NOTE: REMOVE RGB IN EQUAL ON-TIME STEPS FOR ADJUSTING SPOKES |
| 12 | 1 | 0.5 | 0.5 | -3 | -2 | -2 | NOTE: REMOVE/ADD RGB IN EQUAL LSB STEPS FOR RAMPING TO MAINTAIN WHITE POINT. |
| 14 | 1 | 0.5 | 0.5 |    |    |    |  |
| 16 | 1 | 0.5 | 0.5 | -2 | -1 | -1 |  |
| 18 | 1 | 0.5 | 0.5 | -1 | 0  | 0  |  |
| 20 | 1 | 0.5 | 0.5 | 0  | 1  | 1  |  |
| 22 | 1 | 0.5 | 0.5 | 1  | 2  | 2  |  |
| 24 | 1 | 0.5 | 0.5 | 2  | 3  | 3  |  |
| 27 | 2 | 1   | 1   | 3  | 4  | 4  | Dynamic range of SHT busis +7/-8. rgb and W bit white point must closely match. So must take an extra -1 step on red to cancel more redish W segment. |
| 29 | 2 | 1   | 1   | -4 | -2 | -2 |  |
| 31 | 2 | 1   | 1   | -3 | -1 | -1 |  |
| 33 | 2 | 1   | 1   | -2 | 0  | 0  |  |
| 35 | 2 | 1   | 1   | -1 | 1  | 1  |  |
| 37 | 2 | 1   | 1   | 0  | 2  | 2  |  |
| 39 | 2 | 1   | 1   | 1  | 3  | 3  |  |
| 41 | 2 | 1   | 1   | 2  | 4  | 4  |  |
| 43 | 2 | 1   | 1   | 3  | 5  | 5  |  |

TABLE 2-continued

W-BUS, SPOKE BITS, AND SHT CODES

| | | | | | | | | | | | | Notes |
|---|---|---|---|---|---|---|---|---|---|---|---|---|
| 45 | 0 | 0 | 0 | 0 | 1.0 | 1.0 | 1.0 | 1.0 | 3 | 5 | 5 | RG1 + WB2-r-g-b, GW1 + BR2-r-g-b 100% |
| 47 | 0 | 0 | 0 | 0 | 1.0 | 1.0 | 1.0 | 1.0 | -4 | -5 | -7 | RG1 + WB2 is on 50% |
| 49 | 0 | 0 | 0 | 0 | 1.0 | 1.0 | 1.0 | 1.0 | -3 | -4 | -6 | GW1 + BR2 is on 50% |
| 51 | 0 | 0 | 0 | 0 | 1.0 | 1.0 | 1.0 | 1.0 | -2 | -3 | -5 | |
| 53 | 0 | 0 | 0 | 0 | 1.0 | 1.0 | 1.0 | 1.0 | -1 | -2 | -4 | |
| 55 | 0 | 0 | 0 | 0 | 1.0 | 1.0 | 1.0 | 1.0 | 0 | -1 | -3 | |
| 57 | 0 | 0 | 0 | 0 | 1.0 | 1.0 | 1.0 | 1.0 | 1 | 0 | -2 | |
| 59 | 0 | 0 | 0 | 0 | 1.0 | 1.0 | 1.0 | 1.0 | 2 | 1 | -1 | |
| 61 | 1 | 0 | 0 | 0 | 1.0 | 1.0 | 1.0 | 1.0 | 3 | 2 | 0 | |
| 63 | 1 | 0.5 | 0.5 | 0 | 1.0 | 1.0 | 1.0 | 1.0 | 4 | 3 | 1 | |
| 65 | 1 | 0.5 | 0.5 | 0 | 1.0 | 1.0 | 1.0 | 1.0 | -3 | -3 | -5 | Boundary Dispersion for PWM is inherent. |
| 67 | 1 | 0.5 | 0.5 | 0 | 1.0 | 1.0 | 1.0 | 1.0 | -2 | -2 | -4 | |
| 69 | 1 | 0.5 | 0.5 | 0 | 1.0 | 1.0 | 1.0 | 1.0 | -1 | -1 | -3 | |
| 71 | 1 | 0.5 | 0.5 | 0 | 1.0 | 1.0 | 1.0 | 1.0 | 0 | 0 | -2 | |
| 73 | 1 | 0.5 | 0.5 | 0 | 1.0 | 1.0 | 1.0 | 1.0 | 1 | 1 | -1 | |
| 75 | 1 | 0.5 | 0.5 | 0 | 1.0 | 1.0 | 1.0 | 1.0 | 2 | 2 | 0 | |
| 78 | 1 | 0.5 | 0.5 | 0 | 1.0 | 1.0 | 1.0 | 1.0 | 3 | 3 | 1 | |
| 80 | 1 | 0.5 | 0.5 | 0 | 1.0 | 1.0 | 1.0 | 1.0 | 4 | 4 | 2 | |
| 82 | 1 | 0.5 | 0.5 | 0 | 1.0 | 1.0 | 1.0 | 1.0 | 5 | 5 | 3 | |
| 84 | 2 | 1 | 1 | 1 | 1.0 | 1.0 | 1.0 | 1.0 | -2 | -1 | -3 | Must double-step blue to fix chrom |
| 86 | 2 | 1 | 1 | 1 | 1.0 | 1.0 | 1.0 | 1.0 | -1 | 0 | -2 | a error in white ramp |
| 88 | 2 | 1 | 1 | 1 | 1.0 | 1.0 | 1.0 | 1.0 | 0 | 1 | -1 | |
| 90 | 2 | 1 | 1 | 1 | 1.0 | 1.0 | 1.0 | 1.0 | 1 | 2 | 0 | |
| 92 | 2 | 1 | 1 | 1 | 1.0 | 1.0 | 1.0 | 1.0 | 1 | 2 | 0 | |
| 94 | 2 | 1 | 1 | 1 | 1.0 | 1.0 | 1.0 | 1.0 | 2 | 3 | 2 | |
| 96 | 2 | 1 | 1 | 1 | 1.0 | 1.0 | 1.0 | 1.0 | 3 | 4 | 3 | |
| 98 | 2 | 1 | 1 | 1 | 1.0 | 1.0 | 1.0 | 1.0 | 4 | 5 | 4 | |
| 100 | 2 | 1 | 1 | 1 | 1.0 | 1.0 | 1.0 | 1.0 | 5 | 6 | 5 | |

TABLE 2-continued

W-BUS, SPOKE BITS, AND SHT CODES

| Row | | | | | | | | | | | SHT codes | | |
|---|---|---|---|---|---|---|---|---|---|---|---|---|---|
| 102 | 0 | 0 | 0 | 1.0 | 1.0 | 1.0 | 1.0 | 1.0 | 1.0 | 1.0 | -1 | -3 | -6 |
| 104 | 0 | 0 | 0 | 1.0 | 1.0 | 1.0 | 1.0 | 1.0 | 1.0 | 1.0 | 0 | -2 | -5 |
| 106 | 0 | 0 | 0 | 1.0 | 1.0 | 1.0 | 1.0 | 1.0 | 1.0 | 1.0 | 1 | -1 | -4 |
| 108 | 0 | 0 | 0 | 1.0 | 1.0 | 1.0 | 1.0 | 1.0 | 1.0 | 1.0 | 2 | 0 | ▓ (GW1 + BR2 is on 100%) |
| 110 | 0 | 0 | 0 | 1.0 | 1.0 | 1.0 | 1.0 | 1.0 | 1.0 | 1.0 | 3 | 1 | -1 |
| 112 | 0 | 0 | 0 | 1.0 | 1.0 | 1.0 | 1.0 | 1.0 | 1.0 | 1.0 | 4 | 2 | 0 |
| 114 | 0 | 0 | 0 | 1.0 | 1.0 | 1.0 | 1.0 | 1.0 | 1.0 | 1.0 | 5 | 3 | 1 |
| 116 | 0 | 0 | 0 | 1.0 | 1.0 | 1.0 | 1.0 | 1.0 | 1.0 | 1.0 | 6 | 4 | 2 |
| 118 | 0 | 0 | 0 | 1.0 | 1.0 | 1.0 | 1.0 | 1.0 | 1.0 | 1.0 | ▓ | ▓ | ▓ |
| 120 | 1 | 0.5 | 0.5 | 1.0 | 1.0 | 1.0 | 1.0 | 1.0 | 1.0 | 1.0 | -1 | -2 | -4 |
| 122 | 1 | 0.5 | 0.5 | 1.0 | 1.0 | 1.0 | 1.0 | 1.0 | 1.0 | 1.0 | 0 | -1 | -3 |
| 124 | 1 | 0.5 | 0.5 | 1.0 | 1.0 | 1.0 | 1.0 | 1.0 | 1.0 | 1.0 | 1 | 0 | -2 |
| 126 | 1 | 0.5 | 0.5 | 1.0 | 1.0 | 1.0 | 1.0 | 1.0 | 1.0 | 1.0 | 2 | 1 | -1 |
| 129 | 1 | 0.5 | 0.5 | 1.0 | 1.0 | 1.0 | 1.0 | 1.0 | 1.0 | 1.0 | 3 | 2 | 0 |
| 131 | 1 | 0.5 | 0.5 | 1.0 | 1.0 | 1.0 | 1.0 | 1.0 | 1.0 | 1.0 | 4 | 3 | 1 |
| 133 | 1 | 0.5 | 0.5 | 1.0 | 1.0 | 1.0 | 1.0 | 1.0 | 1.0 | 1.0 | 5 | 4 | 2 |
| 135 | 1 | 0.5 | 0.5 | 1.0 | 1.0 | 1.0 | 1.0 | 1.0 | 1.0 | 1.0 | 6 | 5 | 3 |
| 137 | 1 | 0.5 | 0.5 | 1.0 | 1.0 | 1.0 | 1.0 | 1.0 | 1.0 | 1.0 | ▓ | ▓ | ▓ (RG1 + WB2 is on 100%) |
| 139 | 1 | 0.5 | 0.5 | 1.0 | 1.0 | 1.0 | 1.0 | 1.0 | 1.0 | 1.0 | -1 | -1 | -2 |
| 141 | 2 | 1 | 1 | 1.0 | 1.0 | 1.0 | 1.0 | 1.0 | 1.0 | 1.0 | 0 | 0 | -1 |
| 143 | 2 | 1 | 1 | 1.0 | 1.0 | 1.0 | 1.0 | 1.0 | 1.0 | 1.0 | 1 | 1 | 0 |
| 145 | 2 | 1 | 1 | 1.0 | 1.0 | 1.0 | 1.0 | 1.0 | 1.0 | 1.0 | 2 | 2 | 1 |
| 147 | 2 | 1 | 1 | 1.0 | 1.0 | 1.0 | 1.0 | 1.0 | 1.0 | 1.0 | 3 | 3 | 2 |
| 149 | 2 | 1 | 1 | 1.0 | 1.0 | 1.0 | 1.0 | 1.0 | 1.0 | 1.0 | 4 | 4 | 3 |
| 151 | 2 | 1 | 1 | 1.0 | 1.0 | 1.0 | 1.0 | 1.0 | 1.0 | 1.0 | 4 | 4 | ■ |
| 153 | 2 | 1 | 1 | 1.0 | 1.0 | 1.0 | 1.0 | 1.0 | 1.0 | 1.0 | 5 | 5 | 4 |
| 155 | 2 | 1 | 1 | 1.0 | 1.0 | 1.0 | 1.0 | 1.0 | 1.0 | 1.0 | 6 | 6 | 5 |
| 157 | 2 | 1 | 1 | 1.0 | 1.0 | 1.0 | 1.0 | 1.0 | 1.0 | 1.0 | 7 | 7 | 6 |

TABLE 2-continued

W-BUS, SPOKE BITS, AND SHT CODES

| | | | | | | | | | | | | | | | | | | | | | | | | |
|---|---|---|---|---|---|---|---|---|---|---|---|---|---|---|---|---|---|---|---|---|---|---|---|---|
| 159 | 0 | 0 | 1.0 | 1.0 | 1.0 | 1.0 | 1.0 | 1.0 | 1.0 | 1.0 | 1.0 | 1.0 | 1.0 | 1.0 | | 0 | -2 | -4 | | | | | | |
| 161 | 0 | 0 | 1.0 | 1.0 | 1.0 | 1.0 | 1.0 | 1.0 | 1.0 | 1.0 | 1.0 | 1.0 | 1.0 | 1.0 | -1 | -1 | -3 | | | | | | | |
| 163 | 0 | 0 | 1.0 | 1.0 | 1.0 | 1.0 | 1.0 | 1.0 | 1.0 | 1.0 | 1.0 | 1.0 | 1.0 | 1.0 | 2 | 1 | 0 | -2 | | | | | | |
| 165 | 0 | 0 | 1.0 | 1.0 | 1.0 | 1.0 | 1.0 | 1.0 | 1.0 | 1.0 | 1.0 | 1.0 | 1.0 | 1.0 | ■ | 2 | -1 | | | | | | | |
| 167 | 0 | 0 | 1.0 | 1.0 | 1.0 | 1.0 | 1.0 | 1.0 | 1.0 | 1.0 | 1.0 | 1.0 | 1.0 | 1.0 | 3 | 2 | 0 | | | | | | | |
| 169 | 0 | 0 | 1.0 | 1.0 | 1.0 | 1.0 | 1.0 | 1.0 | 1.0 | 1.0 | 1.0 | 1.0 | 1.0 | 1.0 | 4 | 3 | 1 | | | | | | | |
| 171 | 0 | 0 | 1.0 | 1.0 | 1.0 | 1.0 | 1.0 | 1.0 | 1.0 | 1.0 | 1.0 | 1.0 | 1.0 | 1.0 | 5 | 4 | 2 | | | | | | | |
| 173 | 0 | 0 | 1.0 | 1.0 | 1.0 | 1.0 | 1.0 | 1.0 | 1.0 | 1.0 | 1.0 | 1.0 | 1.0 | 1.0 | 6 | 5 | 3 | | | | | | | |
| 175 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | | | | | | | | | |
| 177 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | -1 | -1 | -3 | | | | | | |
| 180 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 0 | -1 | -2 | | | | | | |
| 182 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | ■ | 0 | -1 | | | | | | |
| 184 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 1 | 0 | 1 | | | | | | |
| 186 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 2 | 1 | 0 | | | | | | |
| 188 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 3 | 2 | 1 | | | | | | |
| 190 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 4 | 3 | 2 | | | | | | |
| 192 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 5 | 4 | 3 | | | | | | |
| 194 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 6 | 5 | 4 | | | | | | |
| 196 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 7 | 6 | 4 | | | | | | |
| 198 | 2 | 1 | 1 | 1.0 | 1.0 | 1.0 | 1.0 | 1.0 | 1.0 | 1.0 | 1.0 | 1.0 | 1.0 | 1.0 | 1.0 | -2 | 0 | -2 | | | | | | |
| 200 | 2 | 1 | 1 | 1.0 | 1.0 | 1.0 | 1.0 | 1.0 | 1.0 | 1.0 | 1.0 | 1.0 | 1.0 | 1.0 | 1.0 | -1 | -1 | -1 | | | | | | |
| 202 | 2 | 1 | 1 | 1.0 | 1.0 | 1.0 | 1.0 | 1.0 | 1.0 | 1.0 | 1.0 | 1.0 | 1.0 | 1.0 | 1.0 | ■ | 2 | 0 | | | | | | |
| 204 | 2 | 1 | 1 | 1.0 | 1.0 | 1.0 | 1.0 | 1.0 | 1.0 | 1.0 | 1.0 | 1.0 | 1.0 | 1.0 | 1.0 | 0 | 3 | 1 | | | | | | |
| 206 | 2 | 1 | 1 | 1.0 | 1.0 | 1.0 | 1.0 | 1.0 | 1.0 | 1.0 | 1.0 | 1.0 | 1.0 | 1.0 | 1.0 | 1 | 4 | 2 | | | | | | |
| 208 | 2 | 1 | 1 | 1.0 | 1.0 | 1.0 | 1.0 | 1.0 | 1.0 | 1.0 | 1.0 | 1.0 | 1.0 | 1.0 | 1.0 | 2 | 5 | 3 | | | | | | |
| 210 | 2 | 1 | 1 | 1.0 | 1.0 | 1.0 | 1.0 | 1.0 | 1.0 | 1.0 | 1.0 | 1.0 | 1.0 | 1.0 | 1.0 | 3 | 6 | 4 | | | | | | |
| 212 | 2 | 1 | 1 | 1.0 | 1.0 | 1.0 | 1.0 | 1.0 | 1.0 | 1.0 | 1.0 | 1.0 | 1.0 | 1.0 | 1.0 | 4 | 7 | ■ | | | | | | |
| 214 | 0 | 0 | 0 | 1.0 | 1.0 | 1.0 | 1.0 | 1.0 | 1.0 | 1.0 | 1.0 | 1.0 | 1.0 | 1.0 | 1.0 | -2 | -2 | -5 | | | | | | |
| 216 | 0 | 0 | 0 | 1.0 | 1.0 | 1.0 | 1.0 | 1.0 | 1.0 | 1.0 | 1.0 | 1.0 | 1.0 | 1.0 | 1.0 | -1 | -1 | -4 | | | | | | |
| 218 | 0 | 0 | 0 | 1.0 | 1.0 | 1.0 | 1.0 | 1.0 | 1.0 | 1.0 | 1.0 | 1.0 | 1.0 | 1.0 | 1.0 | 0 | -1 | -3 | | | | | | |
| 220 | 0 | 0 | 0 | 1.0 | 1.0 | 1.0 | 1.0 | 1.0 | 1.0 | 1.0 | 1.0 | 1.0 | 1.0 | 1.0 | 1.0 | 1 | 0 | -2 | | | | | | |
| 222 | 0 | 0 | 0 | 1.0 | 1.0 | 1.0 | 1.0 | 1.0 | 1.0 | 1.0 | 1.0 | 1.0 | 1.0 | 1.0 | 1.0 | 2 | 1 | -1 | | | | | | |
| 224 | 0 | 0 | 0 | 1.0 | 1.0 | 1.0 | 1.0 | 1.0 | 1.0 | 1.0 | 1.0 | 1.0 | 1.0 | 1.0 | 1.0 | 3 | 2 | 0 | | | | | | |
| 226 | 0 | 0 | 0 | 1.0 | 1.0 | 1.0 | 1.0 | 1.0 | 1.0 | 1.0 | 1.0 | 1.0 | 1.0 | 1.0 | 1.0 | 4 | 4 | 2 | | | | | | |
| 228 | 0 | 0 | 0 | 1.0 | 1.0 | 1.0 | 1.0 | 1.0 | 1.0 | 1.0 | 1.0 | 1.0 | 1.0 | 1.0 | 1.0 | 4 | 4 | 2 | | | | | | |
| 231 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 5 | 5 | 3 | | | | | | |
| 233 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | -2 | -1 | -3 | | | | | | |
| 235 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | -1 | 0 | -2 | | | | | | |
| 237 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 0 | 1 | -1 | | | | | | |
| 239 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 1 | 2 | 0 | | | | | | |
| 241 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 2 | 3 | 1 | | | | | | |
| 243 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 3 | 4 | 2 | | | | | | |
| 245 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 4 | 4 | 3 | | | | | | |
| 247 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 4 | 5 | 4 | | | | | | |
| 249 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | 5 | 6 | 5 | | | | | | |
| 251 | 1 | 0.5 | 0.5 | 1.0 | 1.0 | 1.0 | 1.0 | 1.0 | 1.0 | 1.0 | 1.0 | 1.0 | 1.0 | 1.0 | 1.0 | -2 | -1 | -1 | | | | | | |
| 253 | 2 | 1 | 1 | 1.0 | 1.0 | 1.0 | 1.0 | 1.0 | 1.0 | 1.0 | 1.0 | 1.0 | 1.0 | 1.0 | 1.0 | 0 | 0 | 0 | Full on for W bits, Spoke bits, and RGB bits |
| 255 | 2 | 1 | 1 | 1.0 | 1.0 | 1.0 | 1.0 | 1.0 | 1.0 | 1.0 | 1.0 | 1.0 | 1.0 | 1.0 | 1.0 | | | | | | | | | |

Thus, although there has been disclosed to this point a particular embodiment spoke light recapture in sequential color imaging systems and a method thereof, is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of producing an image, said method comprising the steps of:

providing a sequential color beam of light, said sequential color beam of light changing color during each frame period, each frame period comprising:
   at least two primary color periods; and
   at least one spoke period during which said sequential color beam of light changes color;

determining a desired intensity value for each of said primary colors and a combined-color value;

assigning an amount of said combined color value to be created using said spoke periods to a spoke intensity value;

modulating said sequential color beam of light during said primary color periods with said primary color intensity value;

modulating said sequential color beam of light during at least one said spoke period with said spoke intensity value; and focusing said modulated sequential color beam of light on an image plane to form a multi-color image.

2. The method of claim 1, said modulating said sequential color beam of light during at least one said spoke period comprising:

assigning each data bit of said spoke intensity value to at least one said spoke period such that light during a given portion of a spoke period is focused on said image plane when a corresponding bit of said spoke intensity value is active.

3. The method of claim 2, said assigning comprising at least two data bits to a particular spoke period.

4. The method of claim 3, said assigning comprising one data bit to at least two spoke periods.

5. A method of producing white light in an image pixel, comprising:

providing a sequential color beam of light, said sequential color beam of light changing color during each frame period, each frame period comprising:
   at least two primary color periods; and
   at least one spoke period during which said sequential color beam of light changes color;

providing a desired intensity and color value for an image pixel;

determining a combined color content value of said desired intensity and color value;

allocating at least a portion of said combined color content value to a spoke period value; and enabling a modulator to utilize said sequential color beam of light during at least one said spoke period to form said image pixel dependent on said spoke period value.

6. The method of claim 5, comprising:

said frame period comprising at least one white period during which said sequential beam of light is white light;

allocating at least a portion of said combined color content value to a white period value; and enabling a modulator to utilize said sequential color beam of light during at least one said white period to form said image pixel dependent on said white period value.

7. The method of claim 5, comprising:

said frame period comprising at least one white period during which said sequential beam of light is white light;

allocating at least a portion of said combined color content value to a white period value; and enabling a modulator to utilize said sequential color beam of light during at least one said white period to form said image pixel dependent on said white period value, said enabling performed using spatial temporal modulation.

8. The method of claim 5, comprising:

allocating at least a portion of said combined color content value to a primary period value for each primary color period; and enabling a modulator to utilize said sequential color beam of light during said primary color periods to form said image pixel dependent on said primary period values.

9. The method of claims 5, comprising:

reducing an intensity value for at least one primary color period based on said combined content value.

10. The method of claim 5, comprising:

reducing an intensity value for at least two primary color periods based on said combined content value, at least one primary color intensity value reduced unequally relative to another primary color intensity value.

11. The method of claim 5, comprising:

reducing an intensity value for at least two primary color periods based on said combined content value, at least one primary color intensity value reduced unequally relative to another primary color intensity value to correct the color of said pixel.

* * * * *